(12) United States Patent
DeDontney et al.

(10) Patent No.: US 6,890,386 B2
(45) Date of Patent: May 10, 2005

(54) MODULAR INJECTOR AND EXHAUST ASSEMBLY

(75) Inventors: Jay Brian DeDontney, Prunedale, CA (US); Richard H. Matthiesen, Scotts Valley, CA (US); Samuel Kurita, Scotts Valley, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 0 days.

(21) Appl. No.: 10/194,639

(22) Filed: Jul. 12, 2002

(65) Prior Publication Data

US 2003/0037729 A1 Feb. 27, 2003

Related U.S. Application Data

(60) Provisional application No. 60/305,406, filed on Jul. 13, 2001.

(51) Int. Cl.[7] .......................... C23F 1/00; H01L 21/306; C23C 16/00
(52) U.S. Cl. ................... 118/715; 156/345.33
(58) Field of Search ............... 118/715, 728, 118/50; 156/345.29, 345.33, 345.34, 345.35, 345.36, 345.26, 345.51; 137/262–264, 454.2, 560, 561 R, 561 A, 571–576, 590, 594–596, 599.01, 599.05–599.07, 602; 141/285–286, 37, 44–47, 54, 301, 302, 367; 261/127, 131, 146–147 H

(56) References Cited

U.S. PATENT DOCUMENTS

| | | | | |
|---|---|---|---|---|
| 4,252,595 A | * | 2/1981 | Yamamoto et al. | 156/345.31 |
| 4,590,042 A | * | 5/1986 | Drage | 422/186.06 |
| 4,731,995 A | * | 3/1988 | McFarland, Jr. | 60/313 |
| 5,136,975 A | * | 8/1992 | Bartholomew et al. | 118/715 |
| 5,849,088 A | * | 12/1998 | DeDontney et al. | 118/719 |
| 6,022,414 A | | 2/2000 | Miller et al. | 118/718 |
| 6,056,824 A | * | 5/2000 | Bartholomew et al. | 118/719 |
| 6,063,235 A | * | 5/2000 | Taylor | 156/345.33 |
| 6,086,710 A | * | 7/2000 | Miyashita et al. | 156/345.34 |
| 6,200,389 B1 | * | 3/2001 | Miller et al. | 118/729 |
| 6,352,592 B1 | * | 3/2002 | Bartholomew et al. | 118/719 |
| 6,454,860 B2 | * | 9/2002 | Metzner et al. | 118/715 |
| 6,521,048 B2 | * | 2/2003 | Miller et al. | 118/729 |
| 2002/0134507 A1 | * | 9/2002 | DeDontney et al. | 156/345.33 |

FOREIGN PATENT DOCUMENTS

| | | | | |
|---|---|---|---|---|
| JP | 03-099747 | * | 4/1991 | B22C/9/24 |
| JP | 09-189220 | * | 7/1997 | F01N/7/10 |

* cited by examiner

Primary Examiner—Rudy Zervigon
(74) Attorney, Agent, or Firm—Dorsey & Whitney LLP

(57) ABSTRACT

An injector and exhaust assembly for providing delivery of gas to a substrate is provided. The injector and exhaust assembly comprises at least two injectors positioned adjacent each other and spaced apart to form at least one exhaust channel therebetween, and a mounting plate for securing the at least two injectors, wherein each of the at least two injectors being individually mounted to or removed from the mounting plate, and the mounting plate being provided with at least one exhaust slot in fluid communication with the at least one exhaust channel. An exhaust assembly is coupled to the mounting plate to remove exhaust gases from the injectors.

11 Claims, 16 Drawing Sheets

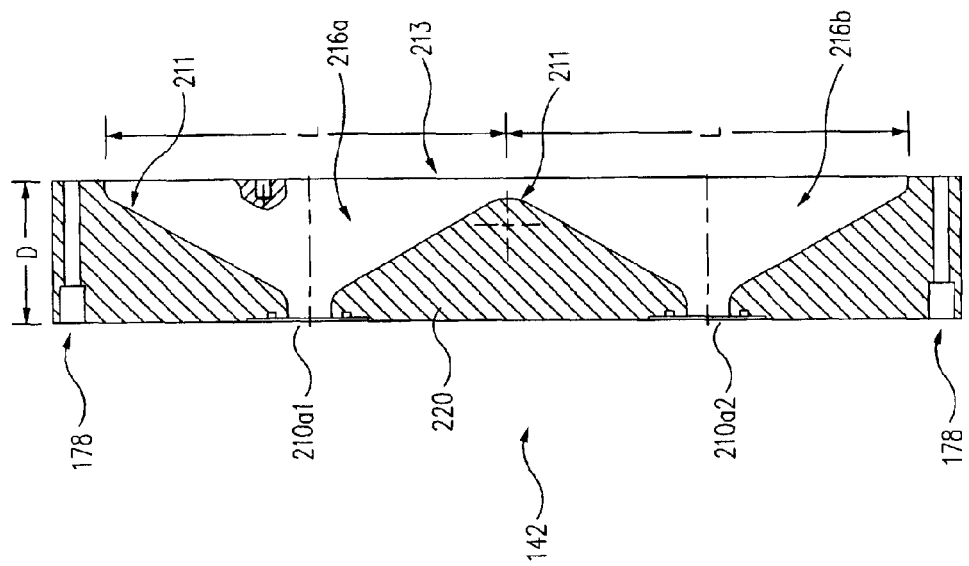
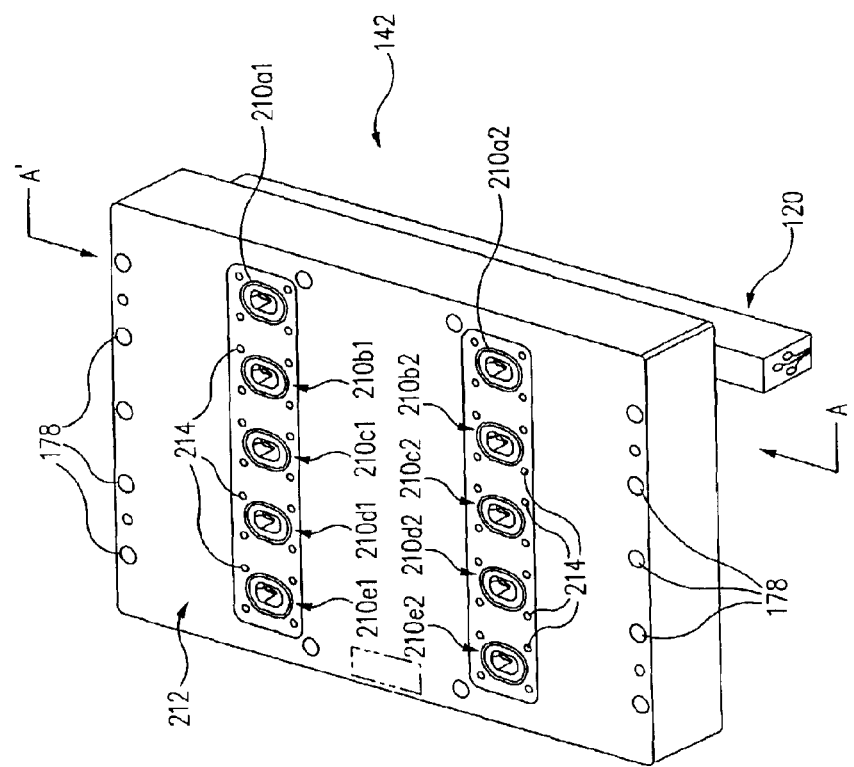

MODULAR INJECTOR AND EXHAUST ASSEMBLY

RELATED APPLICATION

This application claims priority to the U.S. Provisional Patent Application Ser. No. 60/305,406, filed Jul. 13, 2001, which is incorporated by reference herein in its entirety.

FIELD OF THE INVENTION

This invention relates generally to a gas injector for the delivery of gases. More particularly, the invention relates to a modular gas delivery injector and exhaust assembly that promotes substantially uniform distribution of gases.

BACKGROUND OF THE INVENTION

The delivery of gases is a significant processing step in the fabrication of semiconductor devices. Gases are delivered to process semiconductors using a variety of semiconductor fabrication equipment. In one such example, chemical vapor deposition (CVD) systems are used to convey certain gases which, via thermal reaction or decomposition, deposit a layer of material such as an oxide film on the surface of a semiconductor substrate or wafer.

One important component in many types of semiconductor fabrication equipment systems is the injector utilized for delivering gases to the substrate. In a CVD system for example, the gases must be distributed over the substrate so that the gases react and deposit a desirable film or layer at the surface of the substrate. One purpose of the injector is to convey the gases to a desired location in a controlled, and reproducible manner. Controlled distribution of the gases minimizes pre-mixing and prior reaction of the gases, and thereby maximizes the chance of substantially complete, efficient and homogeneous reaction of the gases. If the gas flow is uncontrolled, the chemical reaction will not be optimal and the result will likely be a film which is not of uniform composition and/or thickness. When this occurs, proper functioning of the semiconductor is impaired, and may even fail. Accordingly, it is desirable that an injector design promote the delivery of gases in a controlled and substantially uniform manner.

Given the importance of the injector, many types of designs have been developed. Two examples of prior art injector assemblies are described in U.S. Pat. Nos. 6,022,414 and 6,200,389, which are both incorporated herein by reference. Therein described is a single body elongated or linear type injector having multiple gas outlets extending along the length of the injector. Further described is an injector assembly having multiple injector heads formed within one block of material. While these injectors have shown to be an advantageous design, the manufacturing of the prior art multiple head single body injector assemblies are costly. The fabrication time is lengthy as each injector is machined (using wire EDM) sequentially in the same single billet of material.

For throughput, it is often desired to employ multiple injectors. When using a single body injector assembly, as the number of injector heads increases, so does the fabrication time. The lengthy fabrication time and high cost deters design iteration of the injector geometry which might improve overall process results. Further, there is increased liability during each successive fabrication step of placing the whole multiplicity of injector heads at risk with a single fabrication error. Accordingly, there is a need for an improved injector assembly that promotes easier fabrication and assembly.

In addition to the injector, an exhaust system, typically coupled to the injector assembly for removing the gases, also plays an important role in promoting substantially uniform and/or controlled delivery of gases to the substrate. There is continuous effort in the industry to develop improved exhaust systems, particularly systems which remove the gases in a substantially uniform manner. As the number of injectors increases, so does the complexity of the exhaust system and problems occur such as balancing of the exhaust gas flow. Since multiple injectors are desirable for increased throughput, there is a need for the development of improved exhaust systems as well.

SUMMARY OF THE INVENTION

It is an object of the present invention to provide an improved injector for the delivery of gases. More particularly, it is an object of the present invention to provide a modular gas delivery injector and exhaust assembly.

In one aspect the present invention provides an injector assembly for delivery of gas to a substrate, comprised of one or more inner injector heads positioned adjacent each other and spaced apart to form an exhaust channel therebetween. One or more end injector heads are positioned adjacent and outside of the one or more injector heads and spaced apart to form an exhaust channel therebetween. A mounting plate is provided having a plurality of securing apertures for individually securing each of the injectors and end injector heads, wherein the injector and end injector heads may be individually removed or added to the injector assembly.

In another aspect of the present invention, the injector assembly further includes an exhaust assembly coupled to the mounting plate for removing gases from the injector heads. Of particular advantage the present invention provides for exhausting the inner injector heads and the end injector heads separately. This promotes controlled exhausting of the gases even when the geometry of the system is un-balanced.

In a further aspect of the present invention, an exhaust assembly is provided comprised of a lower exhaust plate coupled to the mounting plate. The lower exhaust plate has tapered exhaust channels formed therein which extend along the substantial length of the lower exhaust plate. An upper exhaust plate is coupled to the lower exhaust plate. The upper exhaust plate has exhaust ports formed therein which are contoured and comprised of an elongated opening at a base end extending along the substantial length of the upper exhaust plate and terminating in dual ports at a top surface of the upper exhaust plate. The tapered exhaust channels and the exhaust ports are in fluid communication with the exhaust channels in the injector assembly.

In yet another aspect of the present invention, the exhaust assembly further comprises an outer exhaust manifold in fluid communication with the end injector heads, and an inner exhaust manifold assembly in fluid communication with the inner injector heads. In one embodiment the inner exhaust manifold includes a plate having a plurality of through passages formed therein. A plurality of tubes are provided and a tube is coupled to each one of the through passages. The tubes are coupled to a balancing unit. The balancing unit has an inlet for each of the plurality of tubes and a single outlet. This provides for balanced exhaust flow even when the injector assembly has an un-even or un-balanced number of exhaust channels.

BRIEF DESCRIPTION OF THE DRAWINGS

Other objects and advantages of the invention become apparent upon reading of the detailed description of the invention and the appended claims provided below, and upon reference to the drawings, in which:

FIG. 7 shows a top elevated view of one implementation of a second (upper) exhaust plate in accordance with one embodiment of the present invention;

FIG. 8 depicts a cross-sectional view of the second exhaust plate taken along line A–A' of FIG. 7;

DETAILED DESCRIPTION OF THE INVENTION

In general, the present invention provides a modular chemical or gas injector and exhaust assembly capable of providing gas distribution along a length, in particular the length of the injector, and provides for a plurality of individual injector heads to be cooperated to form the injector and exhaust assembly which addresses the shortcomings of the prior art. The injector assembly of the present invention consists of a plurality of injector heads cooperated to form the assembly to deliver one or more gaseous chemicals to a semiconductor wafer or substrate during processing. The injector heads of the present invention comprise one or more axially aligned passages for delivering one or more gases to a delivery surface through one or more distribution channels. The assembly further includes at least two end injector heads each positioned at opposite ends of the assembly. The end injector heads also include one or more axially aligned passages for delivering one or more gases to the delivery surface through one or more distribution channels. In one embodiment, the assembly further includes a mounting plate to which the plurality of injector heads are secured to provide positioning and cooperation of the individual injectors. An exhaust system is coupled with the mounting plate to exhaust or remove the gases delivered by the injector.

Figure 1:
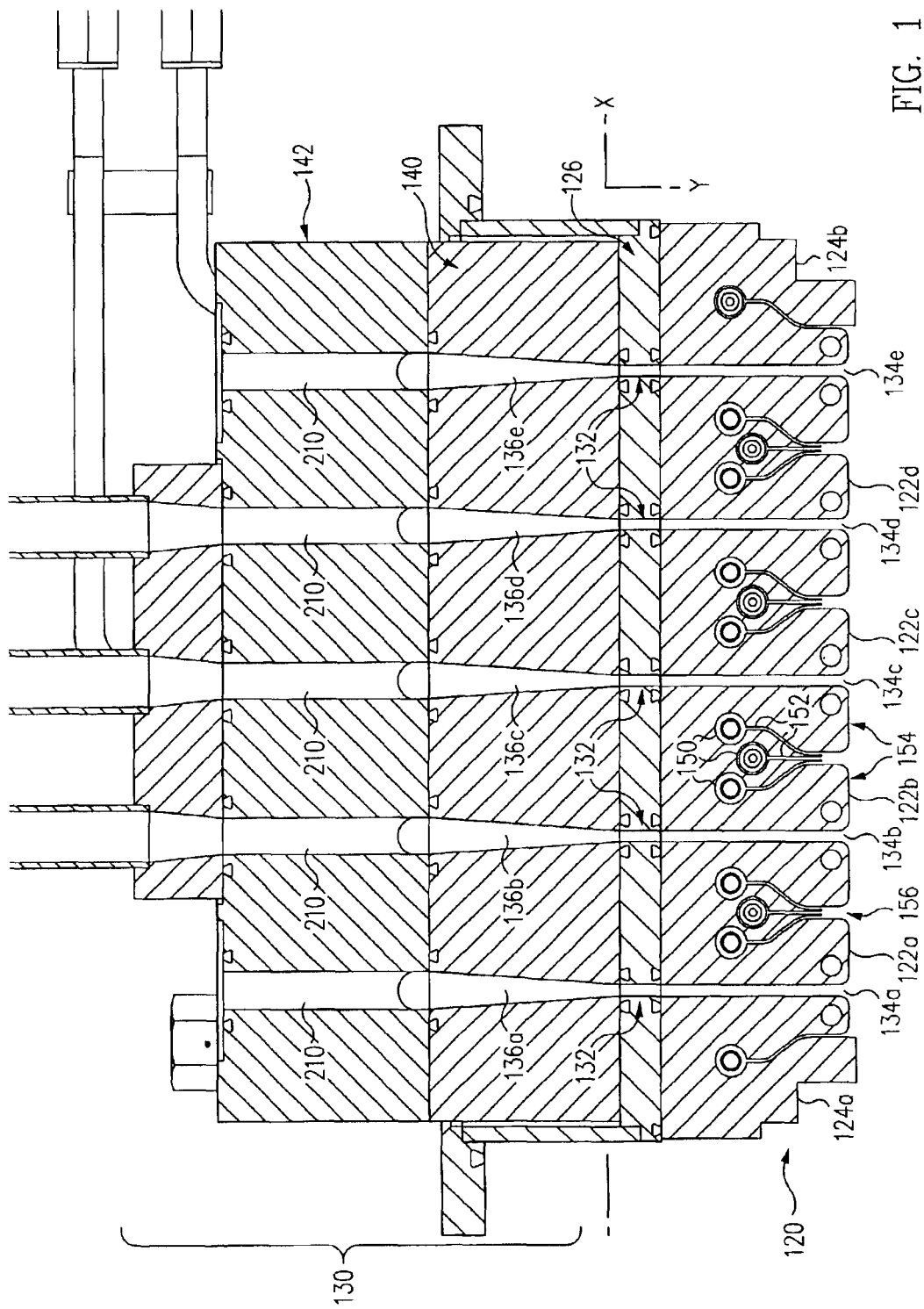
FIG. 1 shows a cross-sectional view of one implementation of one embodiment of the modular chemical injector assembly of the present invention.

More specifically, FIG. 1 depicts a schematic diagram of a cross-sectional view of one embodiment of the modular injector assembly 120 of the present invention. In the embodiment shown in FIG. 1, the assembly 120 includes a total of six individual injector heads 122a–d and 124a–b; however, it will be apparent to one skilled in the art that the assembly 120 can be configured with any number of injectors to provide the desired chemical delivery to a substrate 121 (FIG. 3) positioned proximate the injector assembly 120. The six injector heads include inner injector heads 122 a–d, and end injector heads 124a–b positioned at each distal end of the assembly along the X-axis. All of the injector heads, 122a–d and 124a–b, are positioned and secured to a mounting plate 126. The mounting plate 126 is sufficiently rigid to support and maintain the positioning of the weight of the injector heads. The mounting plate 126 is coupled to an exhaust system 130, described in detail below. Although not shown, the entire injector and exhaust assembly are generally housed within a system such as a CVD system, for example of the type described in U.S. Pat. Nos. 6,022,414; 6,200,389; and U.S. Ser. No. 09/757,542, the entire disclosures of which are incorporated by reference herein.

In one embodiment, the inner injector heads 122a–d and end injector heads 124a–b (sometimes collectively referred to as "injectors") are positioned such that exhaust channels 134a–e are formed between each end injector and an adjacent injector, and between each adjacent injectors. For example a first exhaust channel 134a is formed between a first end injector 124a and a first injector 122a. A second exhaust channel 134b is formed between the first injector 122a and a second injector 122b. A third exhaust channel 134c is formed between the second and third injectors 122b and 122c. A fourth exhaust channel 134d is formed between the third and fourth injectors 122c and 122d. A fifth exhaust channel 134e is formed between the fourth injector 122d and the second end injector 124b. The injector heads 122 and end injectors 124 are configured and positioned such that the exhaust channels extend the height of the injectors along a Y-axis and into the mounting plate 126. The inner injector heads and end injector heads are fixed to the mounting plate 126 such that each of the exhaust channels 134 are in alignment with corresponding exhaust slots 132 formed in the mounting plate 126 and exhaust system or assembly 130 as described in detail below.

Figure 2:
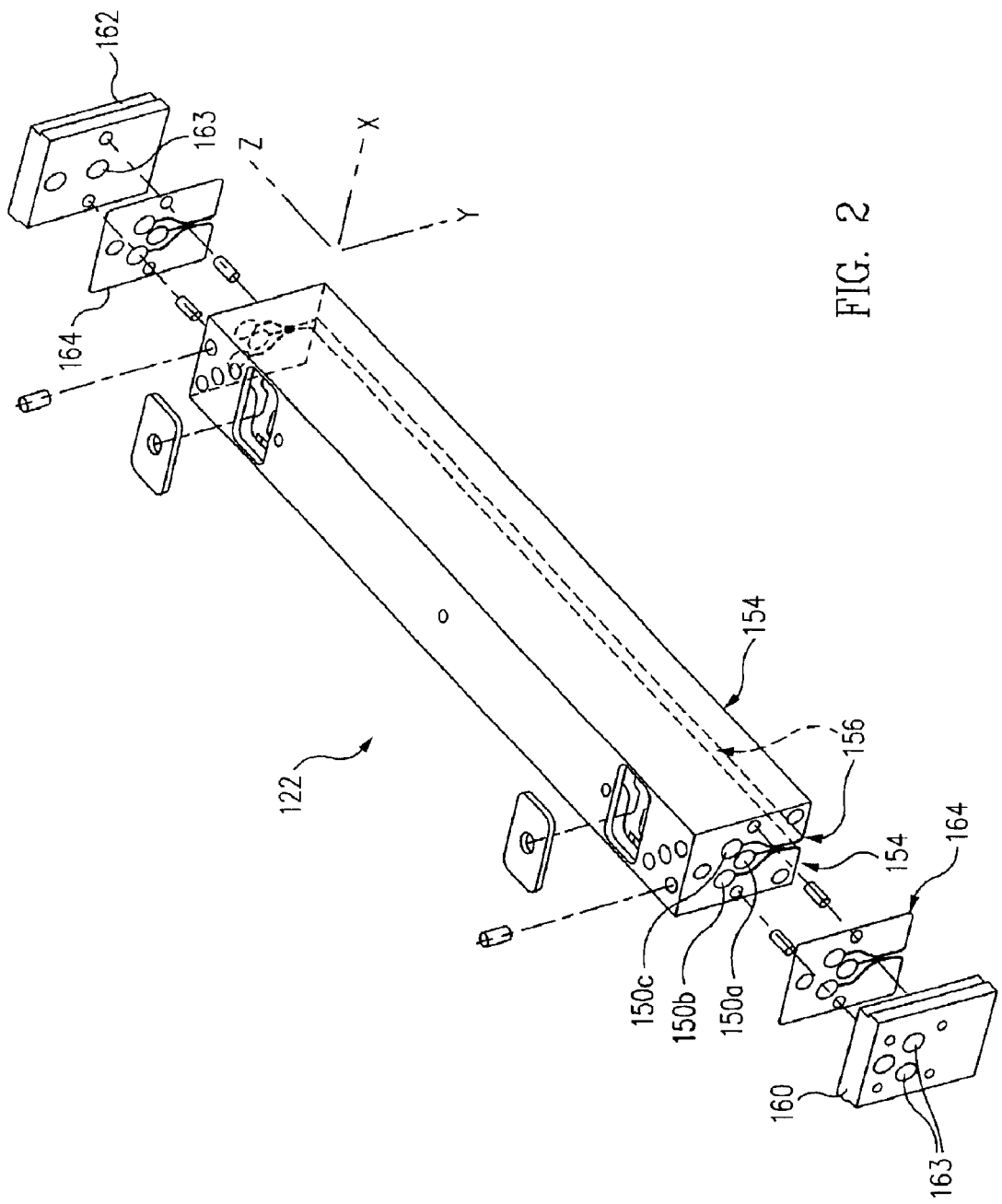
FIG. 2 depicts a simplified assembly view of one implementation of one embodiment of a single modular injector head according to one embodiment of the present invention.
Figure 3:
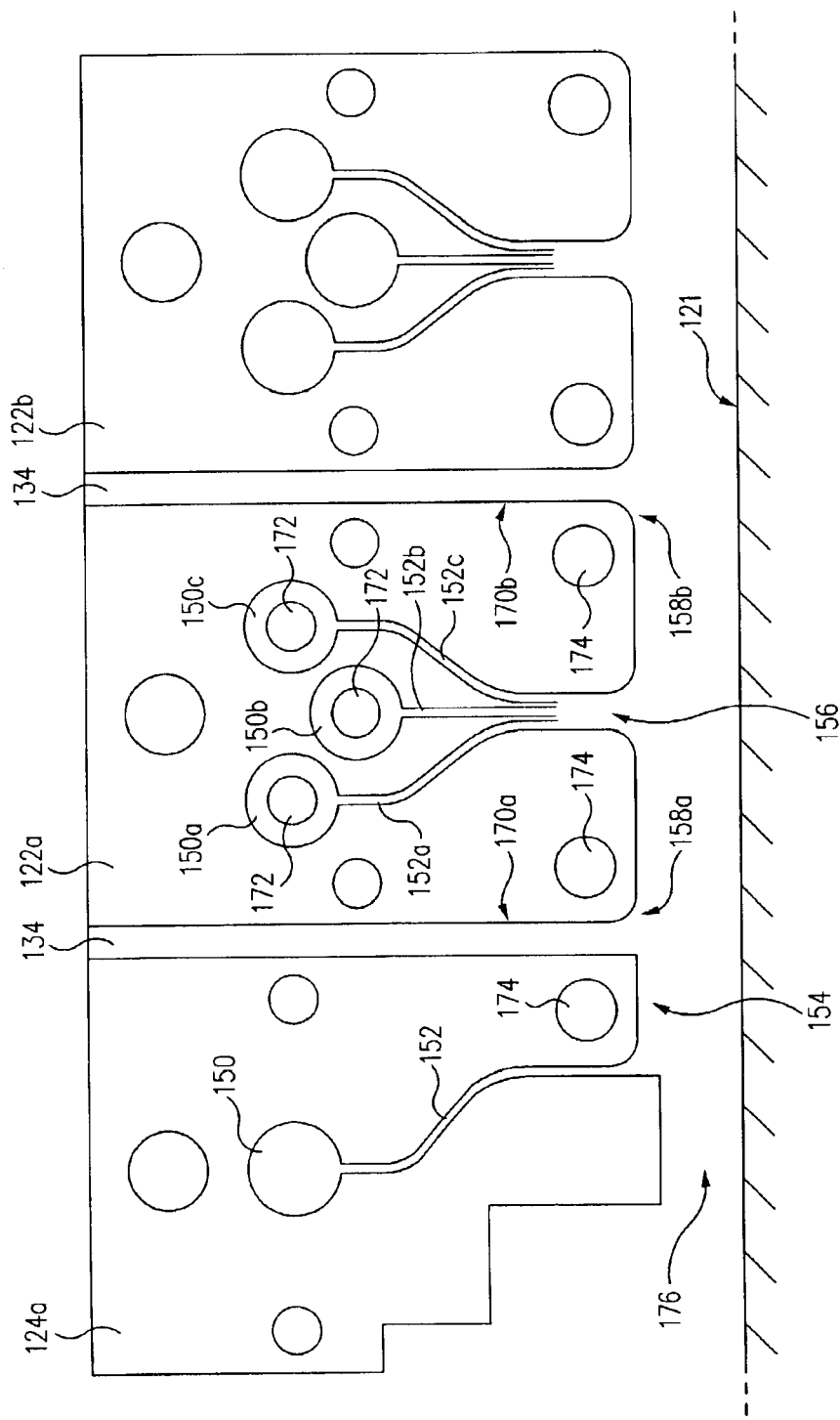
FIG. 3 shows a partial, blown up, cross-sectional view of multiple injector heads and one end injector of FIG. 1.

Referring to FIGS. 2 and 3, each injector head 122a–d includes one or more elongated passages 150 which extend the length of the injector along the Z-axis (shown into the page in FIG. 1). A distribution channel 152 extends from each elongated passage 150 to a chemical delivery surface 154. Each distribution channel 152 extending from each elongated passage 150 converges at a region 156 defined within the delivery surface 154. The region 156 may be recessed as shown in FIGS. 1 and 3. Alternatively, the region 156 may be planar or even concave. The distribution channels 152, regions 156 and delivery surface 154 may extend the length of the injector heads 122. In an alternative embodiment, the one or more elongated passages 150 and/or the distribution channels 152 may be restricted (such as blocked, plugged and/or filled) at its ends, to prevent one or more of the reactants from spanning the entire length of the injector. This limits the span of the reaction process at the deposition region to within the total length of the injector, and minimizes occurrence of the reaction process past the edges of the wafer 121.

Referring again to FIG. 2, to provide gases to the injector assembly 120, gas inlet end caps 160 and 162 are coupled to each end of the injectors to allow gaseous chemicals to be supplied to the elongated passages 150. The end caps 160 and 162 each contain one or more openings 163 which correspond to any one of the passages 150. The end caps are secured to gas supply inlets (not shown) for delivering gas through the openings 163 and into the passages 150. It is important to note that the openings 163 are not required to be of the same pattern at each end cap 160 or 162, and gas may be conveyed into the passages 150 at either one end or both ends of the injectors depending upon placement of the openings 163 in each end cap. For example as shown in FIG. 2, end cap 160 has two openings 163 that align with passages 150b and 150c, and end cap 162 has one opening 163 that aligns with passage 150a. Seals 164 are positioned between the injector heads and each end cap 160, 162 to provide an air tight seal. The seal 164 may be a braze material, whereupon the braze material melts during the brazing process to form a single body where the end caps 160, 162 are brazed to the injector head. Alternatively, the end caps 160, 162 may be secured to the injector head by a rivet, bolt, pins or substantially any other means for securing metal elements.

To deposit a layer or film of material on the substrate 121, reactant gases are conveyed through the passages and distribution channels to the gas delivery surface 154. Of particular advantage the gases may be separately conveyed in each of the passages 150 and channels 152. This minimizes pre-mixing and/or pre-reaction of the gases. When the gases enter the region 156, the gases mix and react in the area of the gas delivery surface 154, and deposit a layer of material on the surface of the substrate 121. When depositing a silicon dioxide film for example, silane and oxygen, or alternatively TEOS and ozone, may be independently conveyed in each of the passages 150. Additionally, a purge gas such as nitrogen and the like, may be separately conveyed in one or more of the passages 150. The purge gas maybe used to isolate one deposition region from the adjacent regions and may also assist to prevent pre-reaction of the reactant gases. Alternatively, one or more of passages 150 may also be configured to deliver an etchant species to minimize the buildup of deposits within the injector assembly 120.

The delivery surface 154 extends out in both directions from the recessed region to the outer edges 158a–b of the injector head, providing an increased surface area and thus increasing the gas exposure to the product or substrate 121 being exposed (such as a silicon wafer) for providing greater chemical reaction. The elongated passages 150 may include metering tubes 172 which aid in providing uniform distribution of the gases through the elongated passages. In one embodiment, the injectors include one or more additional elongated passages 174 formed within the injector and extending the length of the injector to provide for circulation of a cooling fluid to control the temperature of the injector.

In one embodiment, the end injector heads 124a–b are configured to deliver a purge gas during deposition. The flow of purge gas preferably acts to form an inert gas barrier or semi-seal 176 between the region below the end injector heads 124a–b and the substrate 121 to substantially prevent the reactant gases from escaping the deposition region and into other portions of the CVD apparatus (not shown) or surrounding environment. End injectors 124a,b also include a length of material protruding towards the substrate surface, creating a region of narrow clearance around the perimeter of the injector assembly, between this protrusion and the substrate, creating a "semi-seal". This semi-seal aids in minimizing diffusion of reactant species out of the desired process area. In another embodiment, the end injector heads 124 may be configured to deliver an etchant species to minimize the build-up of deposits within the injector assembly 120.

As described above, the present invention provides a modular injector assembly 120. Each of the injector heads are separate pieces which are arranged and individually mounted to form the assembly 120. This provides great flexibility. Individual injector heads 122, 124 can be swapped out or removed altogether. Additional injector heads 122, 124 can be added. Different types of injector heads 122, 124 can be employed to create different deposition patterns. This allows for the chamber geometry of the equipment system to be modified, optimized and/or tailored to different applications. Injectors 122a–d can be replaced with one injector that spans the entire area occupied by previous injectors 122a–d, creating an injector that has a greatly lengthened gas delivery surface 154. This allows utilization of chemistries and reactions that require a much greater residence time within the process reactor.

Figure 4:
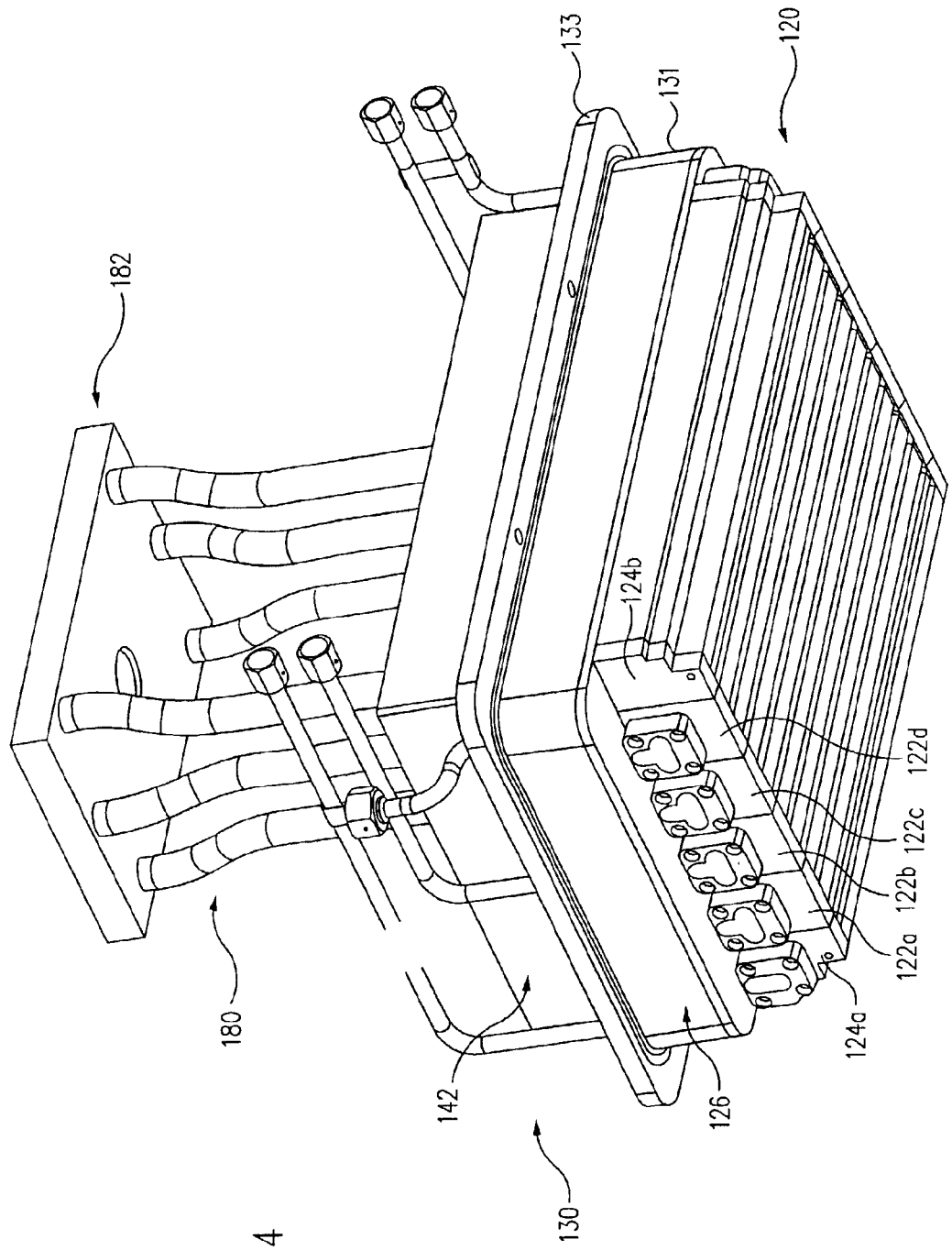
FIG. 4 illustrates a bottom perspective view of an injector assembly according to one embodiment of the present invention.
Figure 5:
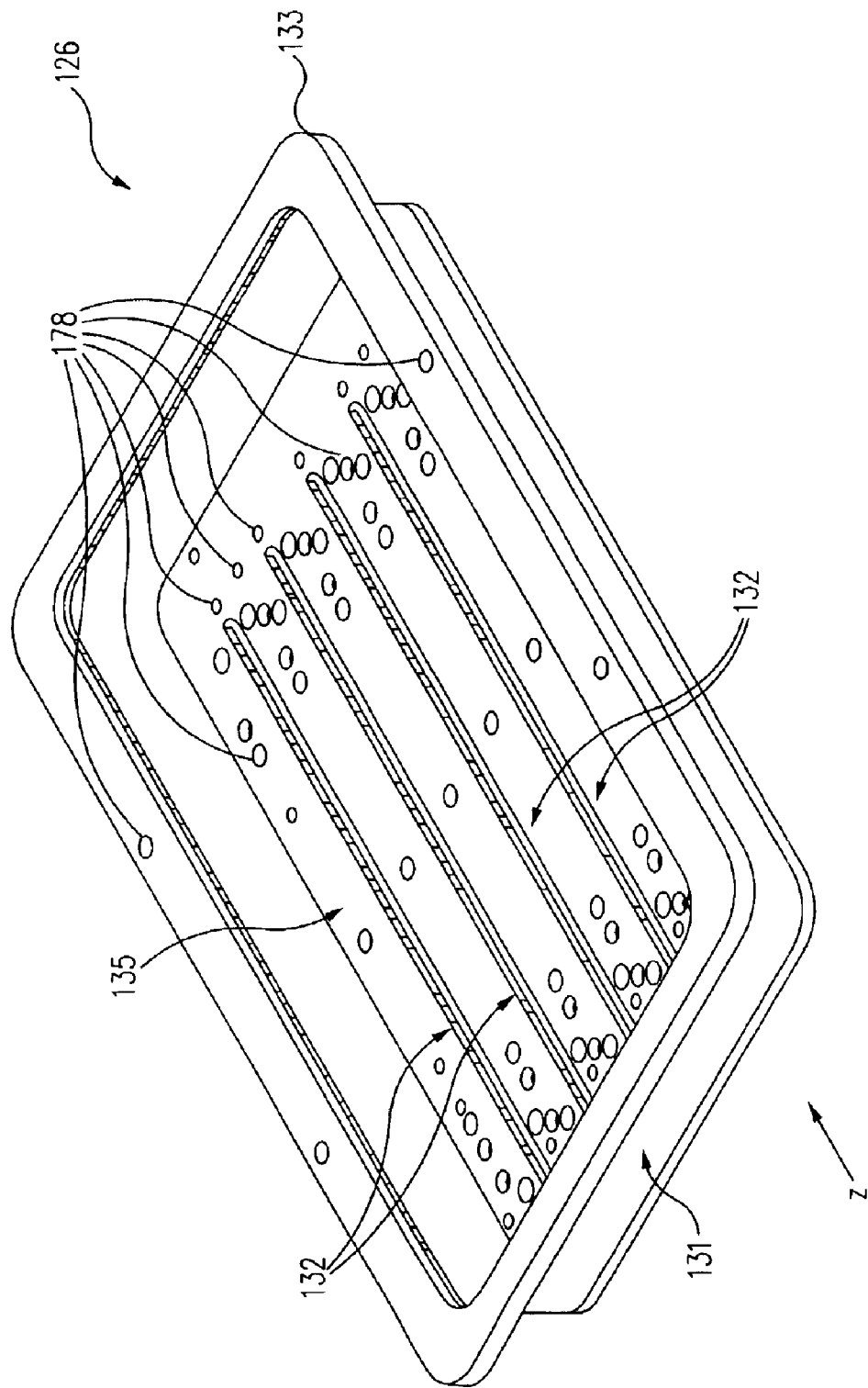
FIG. 5 shows a top elevated view of one implementation of a mounting plate of the present invention.

More specifically, the modular features of the present invention are shown in more detail in FIGS. 4 and 5. In general, the injector assembly 120 is attached to the mounting plate 126. As described above, of particular advantage, the present invention provides for individual attachment of each of the injector heads 122, 124 to the mounting plate 126. In one embodiment as shown in FIG. 5 the mounting plate 126 is formed of a sidewall 131 with a flange 133 forming an upper surface and having a recessed trough with a bottom surface 135. Formed within the bottom surface 135 are one or more exhaust slots 132 and a plurality of securing apertures 178. The exhaust slots 132 extend substantially the length of the mounting plate 126 along the Z-axis, and are aligned with and in fluid communication with each of the exhaust channels 134 of the injector assembly 120. The securing apertures 178 are positioned throughout the bottom surface 135 for securing the injector heads 122, 124 and exhaust plates described below to the mounting plate 126. While one implementation of the mounting plate 126 has been shown, it should be understood by those of skill in the art that the mounting plate 126 may take other forms, such as a flat plate having exhaust slots and securing apertures, without departing from the scope of the present invention.

Coupled to the mounting plate 126 is an exhaust assembly 130, shown in detail in FIGS. 6 to 10. The exhaust assembly 130 is comprised of a lower exhaust plate 140, an upper exhaust plate 142, an outer exhaust manifold 146 and an inner exhaust manifold assembly 148. In general, the lower and upper exhaust plates 140 and 142 serve to interface directly with the exhaust channels 134 of the injectors to remove gases from the injector assembly, and the outer and inner exhaust manifolds 146 and 148 serve to balance the exhaust flow of the gases from the ends and center of the injector assembly to promote controlled and substantially uniform exhausting of the gases.

Figure 6:
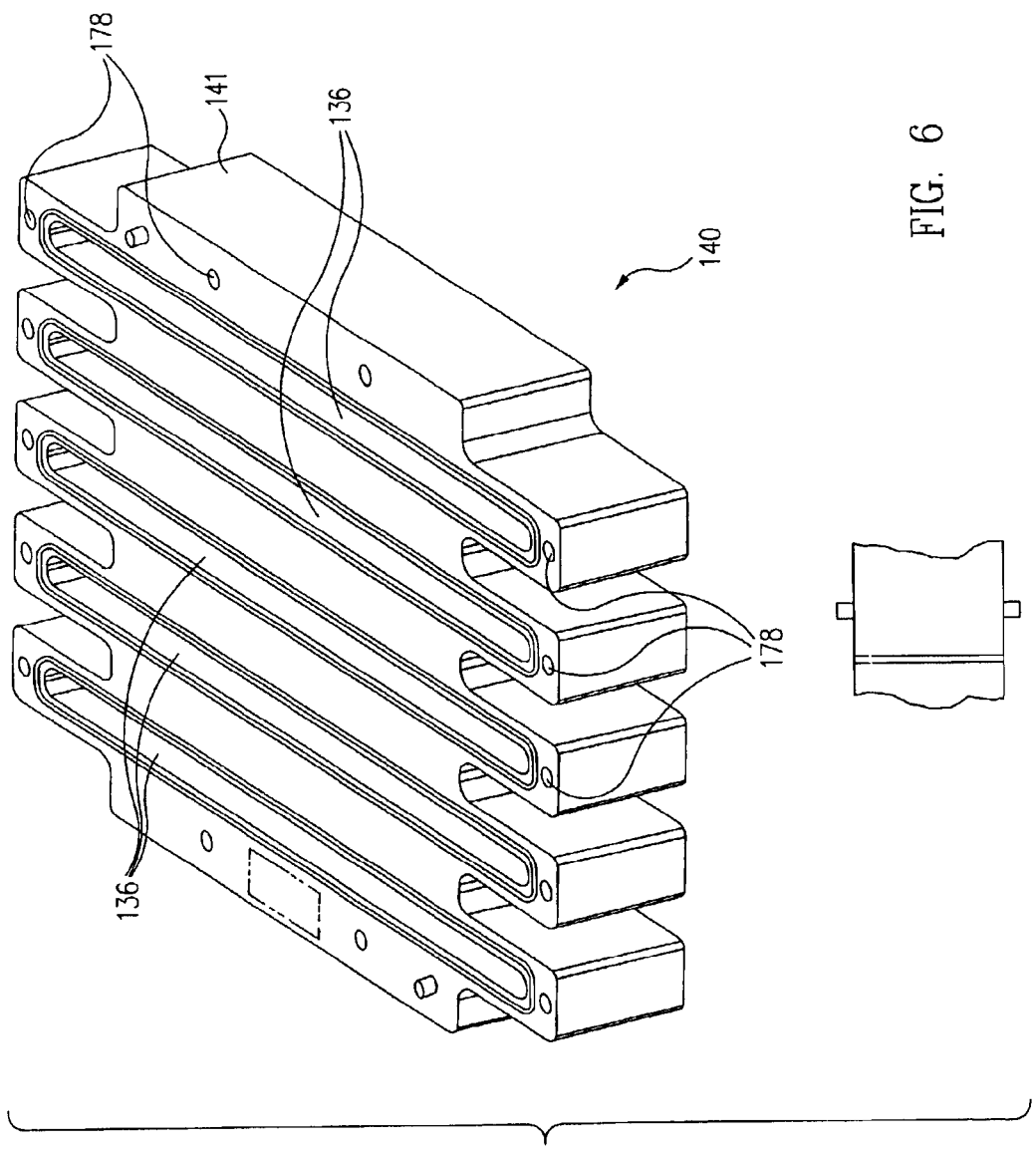
FIG. 6 illustrates a top elevated view of one implementation of a first (lower) exhaust plate according to one embodiment of the present invention.
Figure 9:
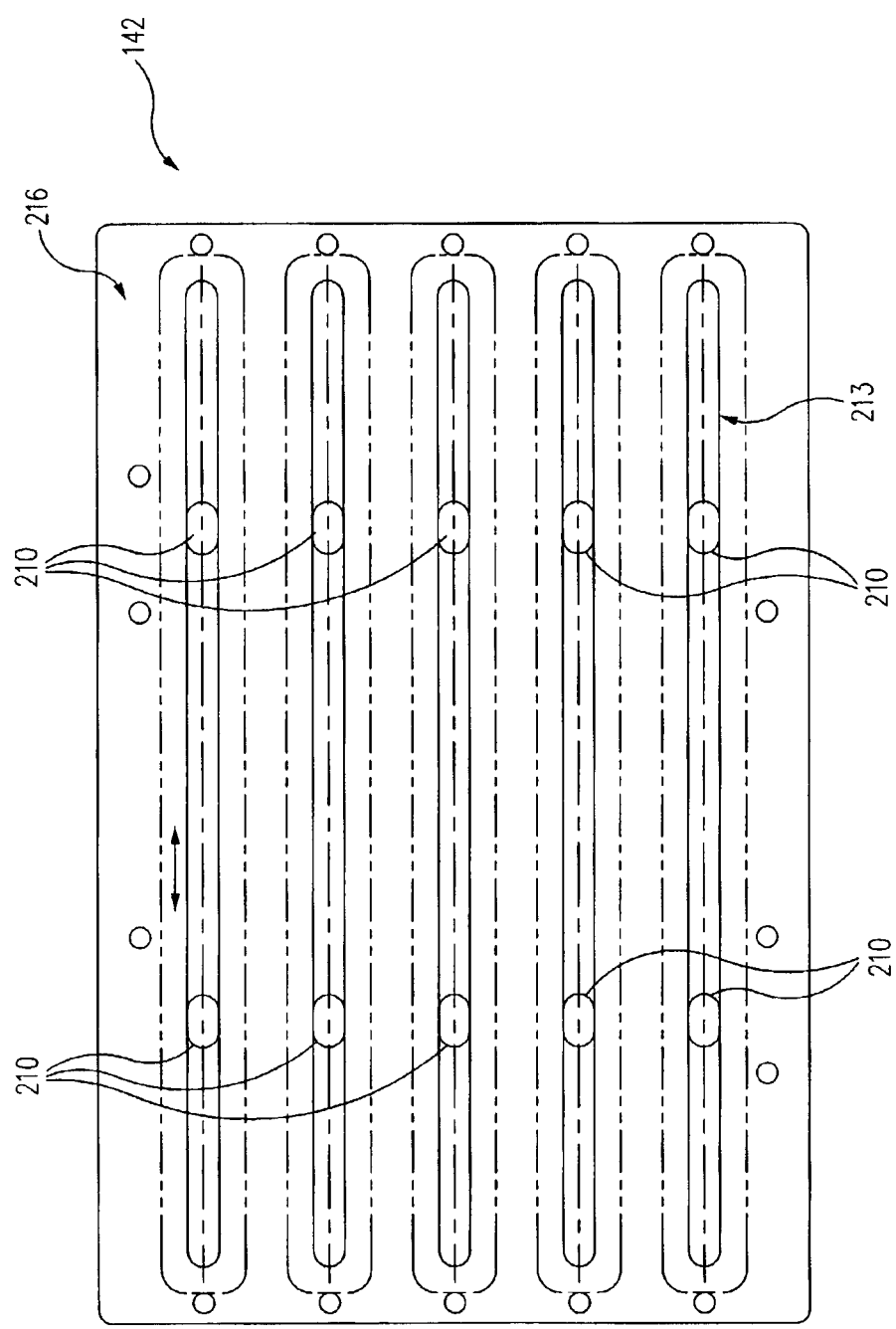
FIG. 9 is a bottom plan view of the second exhaust plate in accordance with one embodiment of the present invention.
Figure 10:
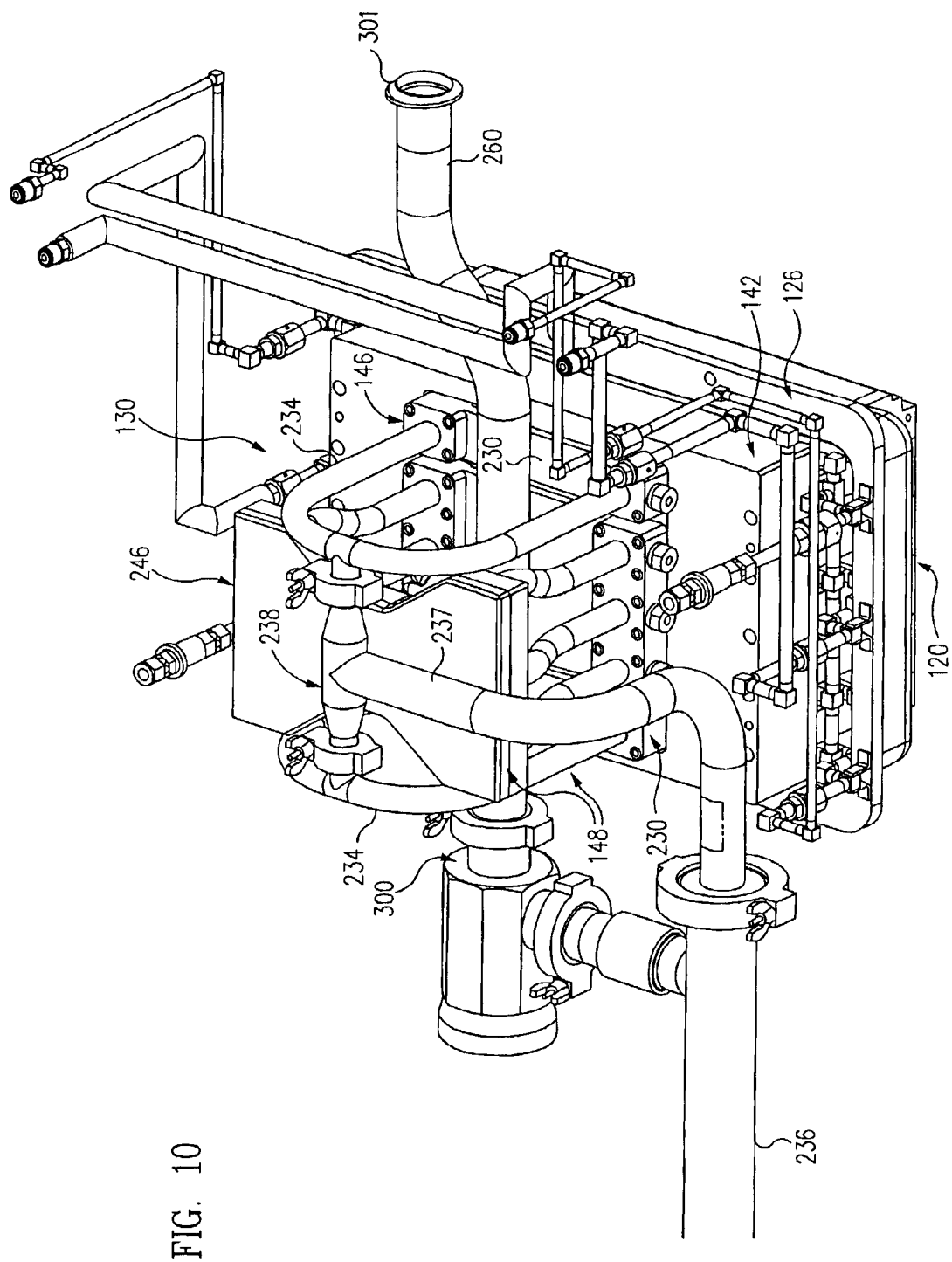
FIG. 10 is a top perspective view of an injector and exhaust assembly in accordance with another embodiment of the present invention.
Figure 11:
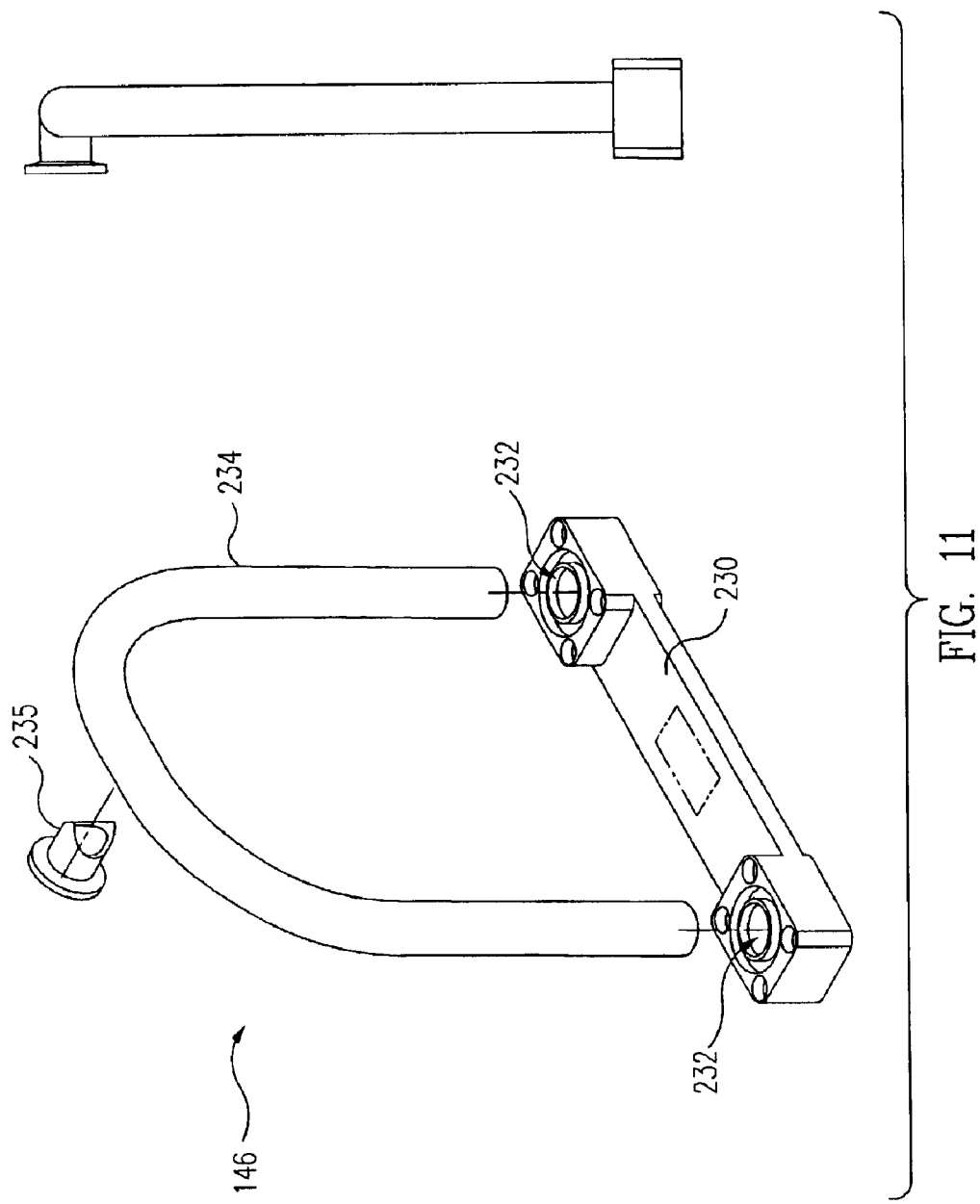
FIG. 11 shows a simplified side elevated view of one implementation of an outer exhaust manifold of the present invention.

The lower exhaust plate 140 is shown in detail with reference to FIG. 6, with a cross sectional view shown in FIG. 1. In general the lower exhaust plate 140 is comprised of a member 141 having one or more outwardly, tapered exhaust channels 136 formed there through. The tapered exhaust channels 136 are elongated and extend substantially the length of the lower exhaust plate 140 along the Z-axis. One tapered exhaust channel 136 is provided for each exhaust slot 134 of the injector assembly 120. The lower exhaust plate 140 is fixed within the mounting plate 126 and is positioned with the injector heads such that the tapered exhaust channels 136 (see FIG. 1) align with the exhaust channels 132 formed in the mounting plate 126 and the exhaust slots 134 formed between adjacent injector heads 122, 124. The tapered exhaust channels 136 are generally narrower at the base adjacent the mounting plate 126, and then taper outwardly in a substantially linear manner to wider at the top adjacent the upper exhaust plate 142. In an alternative embodiment the tapered exhaust channels 136 may be tapered in a contoured manner, instead of a linear manner. For example a wider contoured opening may be placed at the upper end of the channel 136. In some applications it may be beneficial to provide a higher draw at the ends of the injector to reduce uneven deposition on the substrate near the edges that traverses under the injector.

The tapered exhaust channels 136 of the lower exhaust plate 140 further align with exhaust ports 210 of the upper exhaust plate 142 which is coupled adjacent the lower exhaust plate 140. This provides for one substantially continuous exhaust gas flow path from the gas delivery surface 154 and out through the lower and upper exhaust plates. The upper exhaust plate 142 is positioned atop the lower plate 140 and is secured in place to the mounting plate 126. The securing apertures are configured to receive bolts, rivets, pins or substantially any other means for securing the upper and lower exhaust plates with the mounting plate.

Of particular advantage, the present invention provides for removal of the gases in a controlled and/or substantially uniform manner. Specifically, the present invention provides for exhausting gases from a "line source" to a "point source"; that is, gases are exhausted along the length of the injectors (i.e. the line source) via the exhaust channels 134, though the lower and upper exhaust plates 140 and 142 to outlet ports 210 (i.e. the point source) in the top of the upper exhaust plate 142.

This feature is described in more detail with reference to FIGS. 1, and 7 to 9. As described above, the exhaust channels 136 in the lower exhaust plate 140 are tapered outwardly which provides a greater volume for the exhausting gases. The upper exhaust plate 142 includes one or more exhaust ports 210 formed and extending through the second exhaust plate 142. The port 210 is not of uniform shape. As shown in the cross-sectional view of FIG. 8 which runs the length of the injector assembly 120, the port 210a has a wide, elongated open end 213 at its base end which extends the substantial length of the upper exhaust plate along the Z-axis, and then tapers inwardly to terminate in preferably two (i.e. dual) narrower ports 210a1 and 210a2 at the top surface 212 of the upper exhaust plate 142. While two ports are shown, in an alternative embodiment, only one, or more than two ports may be used. To promote substantially uniform flow of the exhaust, the dual exhaust ports 210a1 and 210a2 are positioned such that two interior cavities 216a and 216b are formed for each port separated by a central portion 220, and each of the cavities 216a and 216b are tapered such that the length L at the wide ends 213 of each exhaust port is substantially equal to one half the length of the tapered exhaust channel of the first 136 exhaust plate 140. In one preferred embodiment, the aspect ratio between the height of the exhaust path from the wafer surface to the beginning of the dual outlet in the upper exhaust plate, to the width, is about 0.6 or greater.

Securing apertures 178 are formed in the upper exhaust plate 142 to fix and align the upper exhaust plate with the lower exhaust plate 140 and the mounting plate 126 to ensure alignment of all of the exhaust slots and channels, and to further ensure an air tight seal between the entire assembly. Exhaust tube mounting apertures 214 are formed around each exhaust port 210 to allow the exhaust tubes (described below) to be secured with the upper exhaust plate 142 forming an air tight seal.

Of particular advantage, the exhaust system 130 of the present invention further includes means for balancing the flow of exhaust from the injector heads 122a–6 and the end injector heads 124a–b. Providing a means for balancing the flow of the exhaust promotes greater flexibility and choice of the injector assembly 120 design. For example, providing independent exhaust manifolds for the inner and outer regions of the injector assembly allows for an injector assembly employing an unbalanced or uneven numbers of injectors or exhaust channels (such as that shown in FIG. 1 where there are five exhaust channels 134a to 134e).

More specifically, in one exemplary embodiment, the exhaust system 130 further includes an outer exhaust manifold 146 and an inner exhaust manifold assembly 148 as shown in detail in FIGS. 10 to 17. In general, the outer exhaust gas manifold 146 includes two plates 230, each of which generally extend the substantial length of the injector assembly 120 and have two through passages 232, one passage formed at each end of the plate 230. Connected to each passage 232 on the plate 230 is a U-shaped tube 234. Attached to the U-shaped tube 234, preferably at the top of the bend section, is a suitable connector 235 such as a fishmouth flange for connecting the tube and plate to a common outer exhaust line 237.

The outer exhaust gas manifold 146 is in fluid communication with both of the end injector heads 124a–b, and provides the final exhaust flow path for gases passing through the outermost exhaust channels in the injector assembly 120 (i.e. exhaust channels 134a and 134e in the illustrative exemplary embodiment shown in the figures). Specifically, each plate 230 is attached to the upper exhaust plate 142 such that the through passages 232 at each end of the plate 230 are aligned longitudinally with the dual outlet ports 210a1 and 210a2 that correspond to the exhaust channels of the outermost or end injector heads 124a–b and the outboard half of the injectors 122a,d. Since there are two end injectors 124a and 124b, located at opposite ends of the injector assembly 120, the outer exhaust manifold 146 includes two corresponding plate 230 and tube 234 assemblies positioned at opposite ends of the upper exhaust plate 142. The two plate 230 and tube 234 assemblies are coupled together to the outer exhaust line 237 via a T-connector 238. Thus, to remove gas from the end injector heads 124a–b and the outboard side of injectors 122a,d, the gases flow through the outermost exhaust channels 134a and 134e, up though the corresponding outermost exhaust slots 132 in the mounting plate 126, through the corresponding outermost exhaust channels in the lower and upper exhaust plates 136a and 136e, and 210a and 210e, respectively, and out through the passages 232 and tubes 234 in the outer exhaust manifold, out through the outer exhaust line 237, and finally reaching the common main exhaust duct 236.

Figure 12:
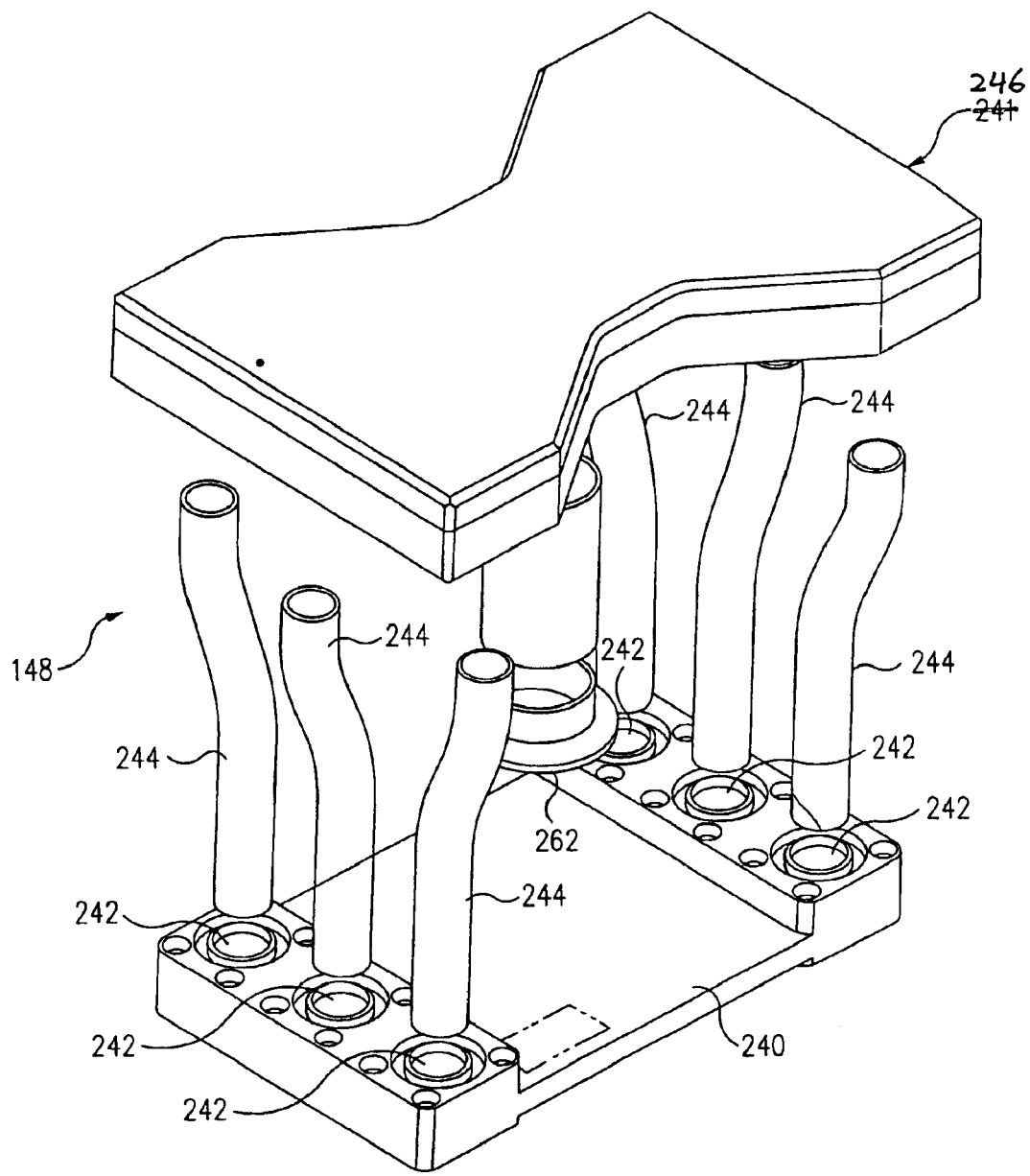
FIGS. 12 and 13 show a side elevated view, and a side plan view, respectively, of an inner exhaust manifold assembly according to one embodiment of the present invention.
Figure 13:
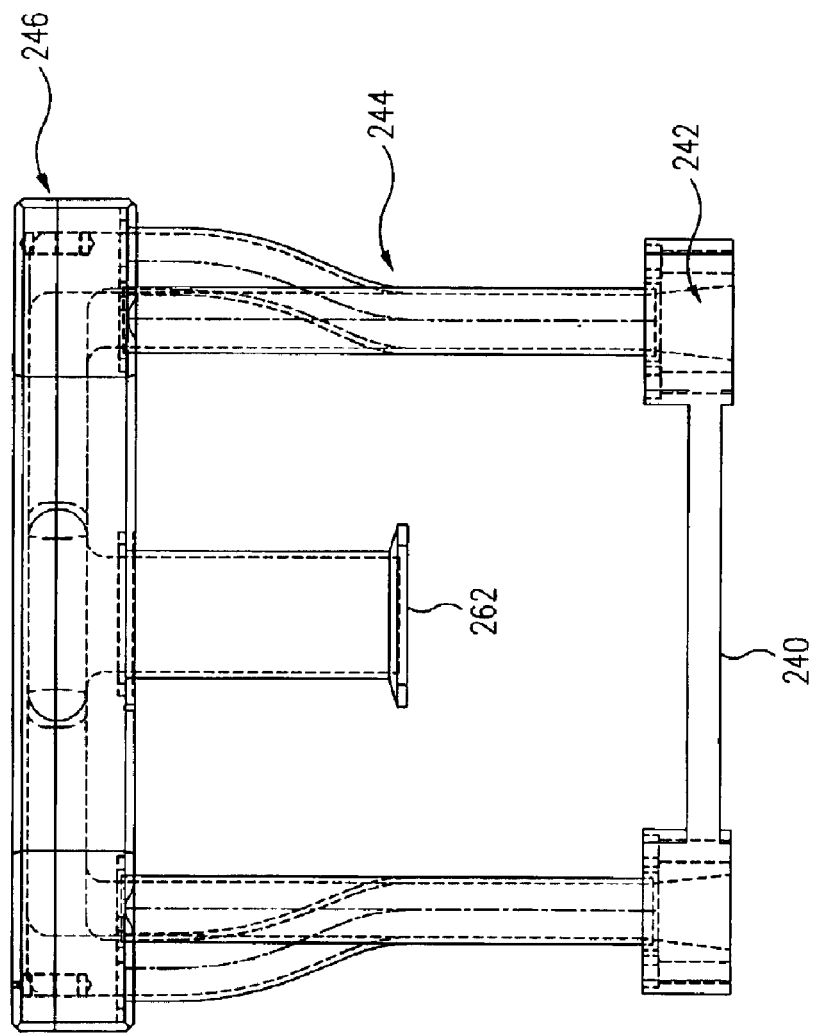
Figure 14C:
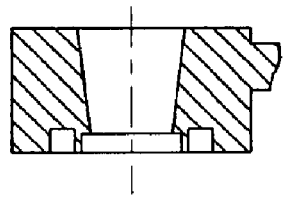
FIG. 14C shows a cross-sectional view taken along line 14C—14C of FIG. 14A.
Figure 14B:
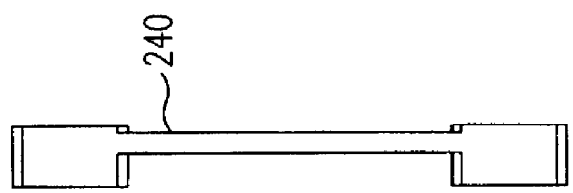
FIGS. 14A and 14B illustrate top and side plan views, respectively, of one implementation of a bottom plate of the inner exhaust manifold assembly.
Figure 14A:
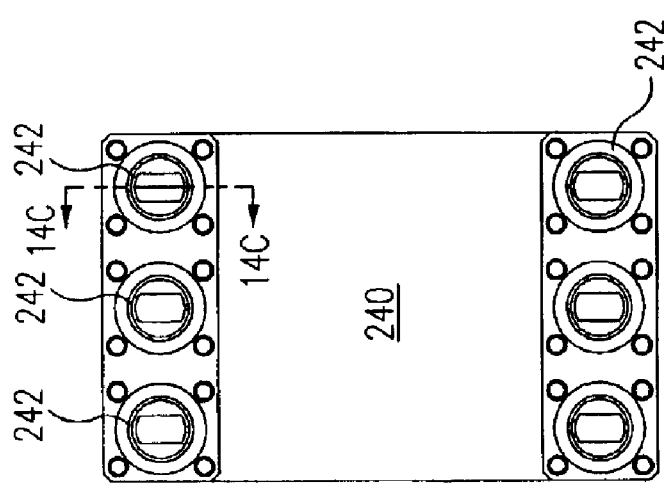
Figure 15:
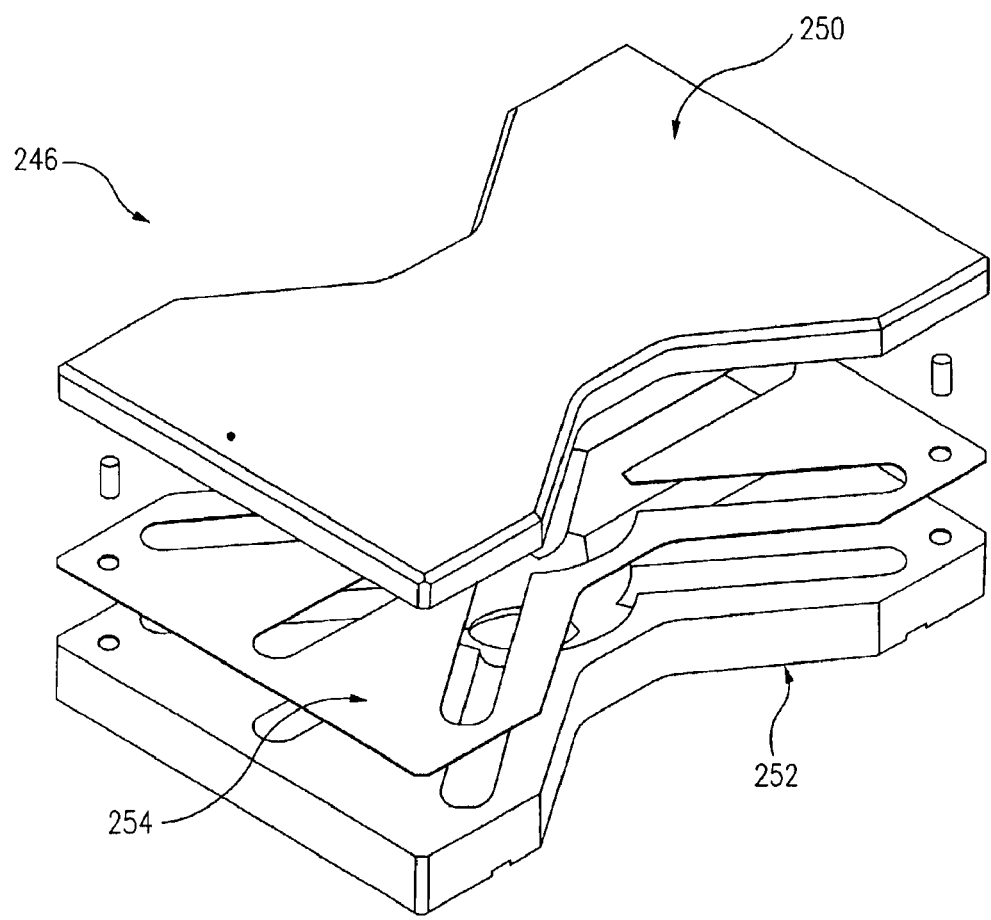
FIG. 15 illustrates an assembly view of one implementation of a top manifold of the inner exhaust manifold assembly.
Figure 16A:
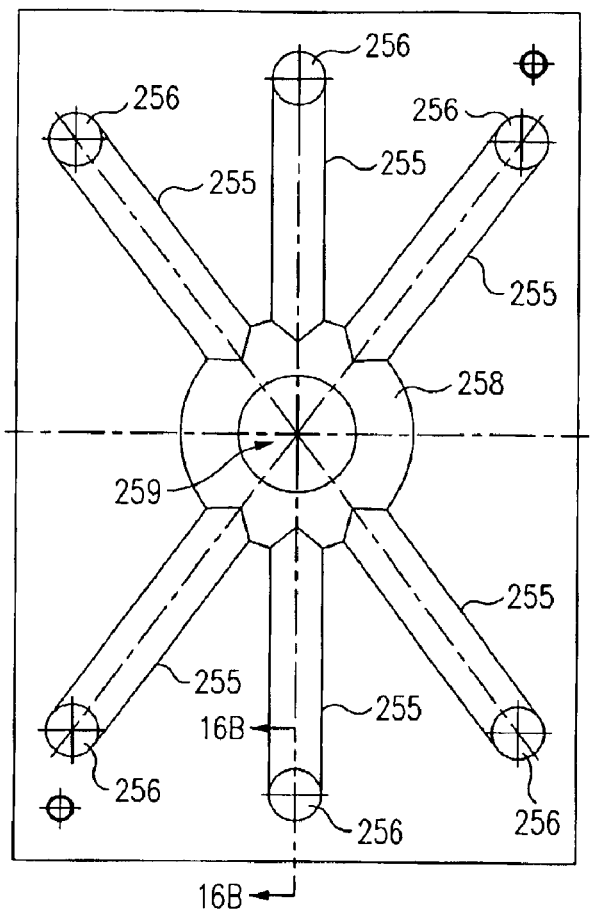
FIG. 16A is a top plan view of a bottom plate of the top manifold of FIG. 15 according to one embodiment of the present invention.
Figure 16B:
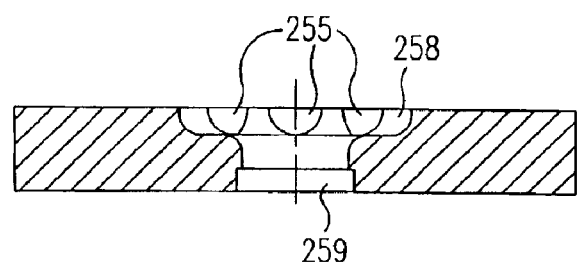
FIG. 16B depicts a cross-sectional view of the bottom plate taken along line 16B—16B of FIG. 16A.

Of significant advantage, the present invention provides for separate exhausting of the inner and outermost exhaust channels of the injector assembly. To exhaust the inner channels (for example exhaust channels 134b, 134c and 134d shown in the illustrative exemplary embodiment) the inner exhaust manifold assembly 148 is used. The inner exhaust manifold assembly 148 is shown more particularly with reference to FIGS. 12 to 17. The inner exhaust manifold includes a plate 240 which generally extends the substantial length of the injector assembly 120. Formed within the plate 240 are a plurality of through passages 242. As shown in FIG. 12, the through passages 242 are provided in pairs of two, with each passage in a pair positioned longitudinally at opposite ends of the plate 240. Connected to each passage 242 on the plate 240 is a tube 244 which couples the respective passage to a balancing unit 246.

Similar to the outer exhaust gas manifold 146, the inner exhaust gas manifold 148 is in fluid communication with the inboard half of inner injector heads 122a–d, and the entirety of the inner injectors 122b,c, and provides the final exhaust flow path for gases passing through the inner exhaust channels in the injector assembly 120 (i.e. exhaust channels 134b, 134c and 134d in the illustrative exemplary embodiment shown in the figures). Specifically, plate 240 is attached to the upper exhaust plate 142 such that the through passages 242 at each end of the plate 240 are aligned longitudinally with the dual outlet ports 210a and 210b that correspond to the exhaust channels of the inner injector heads 122b, 122c and 122d. While the illustrative embodiment shows three inner injector heads with two (i.e. dual) outlet ports for each injector, thereby providing six through passages 242 in the plate 240, those of skill in the art will recognize that other configurations may be employed without departing from the scope of the present invention.

To exhaust the system, gases flow through the inner exhaust channels 134b, 134c and 134d, up though the corresponding inner exhaust slots 132 in the mounting plate 126, through the corresponding inner exhaust channels in the lower and upper exhaust plates 136b, 136c and 136d, and 210b, 210c and 210d, respectively, and out through the passages 242 and into tubes 244. The tubes 244 are coupled at the other end to balancing unit 246. Of particular advantage, the balancing unit 246 promotes substantially uniform flow of the exhaust gas, even when an odd or un-even number of exhaust channels are used.

The balancing unit 246 is shown in more detail in FIGS. 15 to 17B. In general, the balancing unit 246 includes a top plate 250, a bottom plate 252 and a center sheet or braze foil 254. Formed within the bottom plate 252 is a plurality of concave channels 255, shown particularly in FIGS. 16A and 16B. One concave channel 255 is formed for each of the tubes 244. Each of the concave channels 255 have an inlet 256 disposed at one end where the respective tube is coupled to the balancing unit. Each of the concave channels 255 extend inwardly toward the center of the unit 246 where the opposite ends of the channels 255 converge in a central region 258 having an outlet port 259. The outlet port 259 is connected to an inner exhaust line 260 via flange 262. The inner exhaust line 260 connects to main exhaust 236, in this example, through valve 300.

Figure 17A:
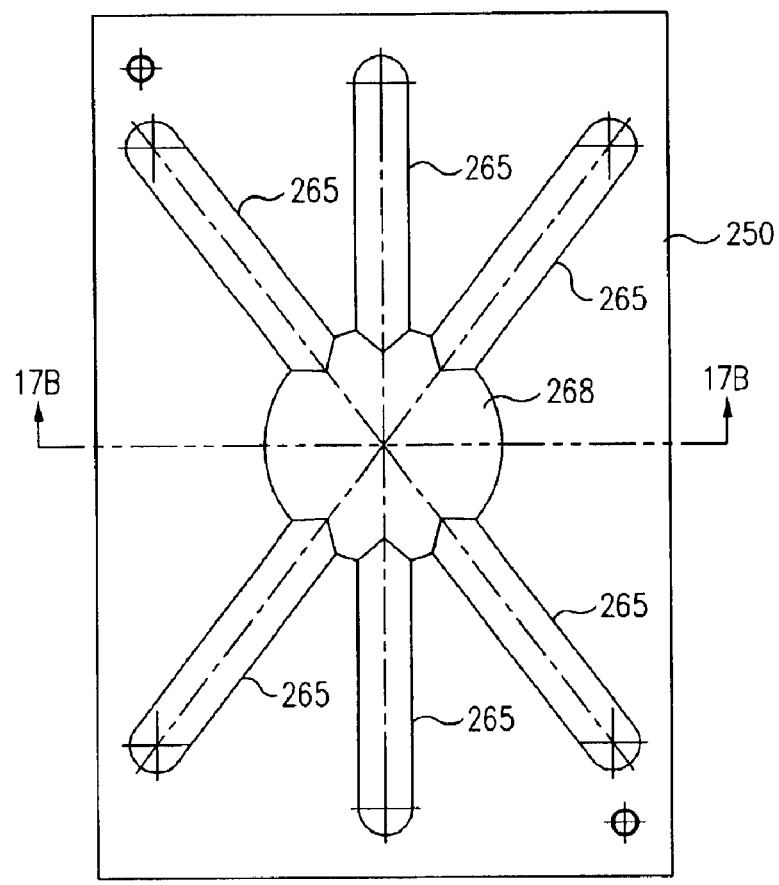
FIG. 17A shows a top plan view of a top plate of the top manifold of FIG. 15 according to one embodiment of the present invention.
Figure 17B:
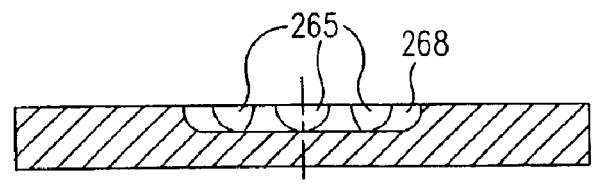
FIG. 17B illustrates a cross-sectional view of the top plate taken along line 17B—17B of FIG. 17A.

As shown in FIGS. 17A and 17B, the top plate 250 also contains a plurality of concave channels 265 which converge inwardly toward the center of the unit in a center recessed region 268. The concave channels 265 and center region in the top plate are a mirror image of the concave channels 255 in the bottom plate 252, except that there is no inlet or outlet. Thus, when the top 250 and bottom 252 plates are sealed, formed therein are a plurality of channels, having a plurality of inlets 256 and a single central outlet 258 in the bottom surface of the balancing unit 246.

The channels in the balancing unit 246 are in fluid communication with the exhaust gas flow from the inner injector heads 122. As described above, this exhaust gas passes into the tubes 244. Each tube 244 is coupled to an inlet 256 in the bottom plate 252. Gas passes into the inlet 256 and through the channel and out through the central outlet 258 and the port 259. Gas from all of the plurality of inlets 256 is conveyed to a single central outlet 258 which balances the gas flow from each of the respective tubes, and being in fluid communication, thus balances the gas flow from each of the exhaust channels 134 in the injector assembly. In one preferred embodiment, exhaust tubes 244 are all of the same length and shape, and the balancing unit 246 provides each exhaust path from the inner ports 210 to be the same length to the final outlet 259. In addition to the aforementioned balancing of the inner and outer exhaust paths, the use of valve 300 allows a second mode of operation of the injector 120. By closing valve 300, a gas species capable of cleaning reaction by-products can be introduced in the inner exhaust tube via fishmouth flange 301. As the valve connecting the inner exhaust to the main exhaust is closed, the cleaning gas is routed backwards through the inner exhaust balancer and on into the process chamber via the multiple inner exhaust paths. The balancing unit acts to distribute the cleaning gas evenly to each exhaust path leading into the process chamber. The effluents of the cleaning gas reacting with the deposition by-products are all removed via the two outer exhaust paths.

In summary, the modular injector and exhaust assembly of the present invention includes a single elongated body supplied with elongated passages and distribution channels. In one embodiment, the elongated passages, distribution channels and recessed regions are formed via wire EDM processing. Gas inlet end caps injectors are then secured, such as brazed, bolted or through other means, onto the injector assembly to form the injector body per se. Metering tubes may be installed which route and distribute separate chemistries from individual inlets in the top of the injector body, to uniform distribution within each elongated channel, which is then routed to the delivery surface. A plurality of these injectors are bolted to a single mounting plate which positions a plurality of injectors with respect to each other. The exhaust paths are formed by the placement of two injectors side by side, separated by a spaced distance. The mounting plate contains exhaust slots that are aligned with the tapered exhaust channel, and additional exhaust tubing or ductwork is bolted to the top of the mounting plate and then to the exhaust assembly to guide the exhaust by-products out of the deposition region. The mounting plate, with injectors, is then installed onto the CVD chamber, whereby the injector delivery surfaces form the inner surfaces of the process chamber.

The modular injectors of the present invention are advantageous over the prior art multi-block injectors. Manufacturing of the modular injectors allows for wire EDM steps to occur in parallel on several machine tools. This will significantly reduce manufacturing time. The modular aspect further allows replacement of individual pieces if they incur damage. Modular injectors also allow for changes to the detailed shape of the injector surface to be made without the time and expense of making such changes in a singular unit.

Brazing the end caps of the injector bodies is dependent on far fewer features per injector, thus improving the success of the braze process, reducing both waste and cost. The individual injectors make manufacturing and handling prior to construction of the assembly easier due to the reduced weight and size. Electro polishing the surfaces in contact with the reacting uses is easier on the smaller, lighter fully exposed individual injectors. Additionally, the cost of waste, due to errors, damage or other problems, is significantly less.

The individual injectors secure to an interface plate (not shown) that provides for gas, water and nitrogen feeds (not shown), as well as establishes the exhaust path width. End caps of individual injectors interlock to prevent gas leakage at the ends of the injectors and provide the semi-seal. Because each injector is individually manifolded, each injector can have different chemical constituents depending on the process needs. The lower exhaust plate can contain a modified outlet shape to influence the deposition gas velocity flow field pattern. The end injectors provide an inert gas region adjacent to both ends of the reactant species region and provides the semi-seal at each distal end of the assembly 120. The geometry of the injector channels, regions, delivery surface and contours can be varied to optimize deposition rates, improved chemical usage efficiency, and improve gas flow paths. Exhaust channels, slots, ports and tubing improve exhaust flow uniformly within chamber.

Other features and advantages of the present invention may be apparent to a person of skill in the art who studies the present invention disclosure. The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

What is claimed is:

1. An injector assembly for delivering gas to a substrate, comprising:
    at least two injectors positioned adjacent each other and spaced apart to form at least one exhaust channel therebetween;
    a mounting plate for securing the at least two injectors, wherein each of the at least two injectors being individually mountable to or removable from the mounting plate, and the mounting plate being provided with at least one exhaust slot in fluid communication with the at least one exhaust channel; and
    an exhaust assembly coupled to said mounting plate for removing gases from said injectors;
    wherein said at least two injectors includes:
        one or more inner injector positioned adjacent each other and spaced apart to form a first exhaust channel therebetween; and
        one or more end injector positioned adjacent and outside of the one or more inner injector and spaced apart to form a second exhaust channel therebetween; and
    wherein said exhaust assembly includes:
        an inner exhaust manifold assembly in fluid communication with said first exhaust channel; and
        an outer exhaust manifold assembly in fluid communication with said second exhaust channel; and
    wherein said inner exhaust manifold assembly includes:
        a plate being provided with a plurality of through passages therein;
        a plurality of tubes coupled to each of said plurality of the through passages; and
        a balancing unit having a plurality of inlets for each of the tubes and a single outlet, wherein said balancing unit is further provided with plurality of channels connecting said plurality of inlets and the single outlet.

2. The injector assembly of claim 1 wherein said at least one exhaust slot extends along the substantial length of the mounting plate and is aligned with the at least one exhaust channel.

3. The injector assembly of claim 1 wherein the balancing unit comprises
    a bottom plate provided with a plurality of concave channels extending inwardly to a center region of the bottom plate, and a plurality of inlets at each end of said plurality of the concave channels; and
    a top plate provided with a plurality of concave channels extending inwardly to a center region of the top plate; wherein
    said concave channels and center regions in the bottom and top plates are mirror image and constitute said plurality of channels connecting said plurality of inlets and said single outlet.

4. An injector assembly, comprising:
    at least two injectors positioned adjacent each other and spaced apart to form at least one exhaust channel therebetween;
    a mounting plate for securing the at least two injectors, wherein each of the at least two injectors being individually mountable to or removable from the mounting plate, and the mounting plate being provided with at least one exhaust slot in fluid communication with the at least one exhaust channel; and
    an exhaust assembly coupled to said mounting plate for removing vases from said injectors, wherein said exhaust assembly comprises a balancing unit for providing uniform flow of exhaust gas;
    wherein said at least two injectors includes:
    one or more inner injector positioned adjacent each other and spaced apart to form a first exhaust channel therebetween;
    one or more end injector positioned adjacent and outside of the one or more inner injector and spaced apart to form a second exhaust channel therebetween;
    said exhaust assembly includes;
    an inner exhaust manifold assembly in fluid communication with said first exhaust channel; and
    an outer exhaust manifold assembly in fluid communication with said second exhaust channel; and
    said inner exhaust manifold assembly includes a balancing unit provided with a plurality of channels in fluid communication with exhaust gas from the inner injectors.

5. The injector assembly of claim 4, wherein the exhaust assembly comprises:
    a lower exhaust plate coupled to said mounting plate, said lower exhaust plate is provided with at least one exhaust channel in fluid communication with said at least one exhaust slot in the mounting plate; and
    an upper exhaust plate coupled to said lower exhaust plate, said upper exhaust plate is provided with at least one exhaust port in fluid communication with said at least one exhaust channel in the lower exhaust plate.

6. The injector assembly of claim 5 wherein said at least one exhaust channel in the lower exhaust plate extends along the substantial length of the lower exhaust plate and is aligned with the at least one exhaust slot in the mounting plate.

7. The injector assembly of claim 6 wherein said at least one exhaust channel in the lower exhaust plate is tapered along the height of the lower exhaust plate.

8. The injector assembly of claim 7 wherein the at least one exhaust channel in the lower exhaust plate is wider at a top surface of the lower exhaust plate, and narrower at a bottom surface of the lower exhaust plate.

9. The injector assembly of claim 5 wherein said at least one exhaust port is comprised of an elongated opening at a base end extending along the substantial length of the upper exhaust plate, said elongated opening being tapered inwardly and terminated in at least one port at a top surface of the upper exhaust plate.

10. The injector assembly of claim 9 wherein said elongated opening is terminated in a plurality of ports at a top surface of the upper exhaust plate.

11. The injector assembly of claim 9 wherein said elongated opening is terminated in two ports at a top surface of the upper exhaust plate.

* * * * *